United States Patent
Nam et al.

(10) Patent No.: US 10,573,806 B1
(45) Date of Patent: Feb. 25, 2020

(54) METHOD OF FABRICATING SEMICONDUCTOR DEVICE

(71) Applicant: SAMSUNG ELECTRONICS CO., LTD., Suwon-si, Gyeonggi-do (KR)

(72) Inventors: Kyungtae Nam, Suwon-si (KR); Seung Pil Ko, Hwaseong-si (KR); Woojin Kim, Hwaseong-si (KR); Hyunchul Shin, Seoul (KR); Youngsoo Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/392,046

(22) Filed: Apr. 23, 2019

(30) Foreign Application Priority Data

Sep. 21, 2018 (KR) .................. 10-2018-0113513

(51) Int. Cl.
  *H01L 43/12* (2006.01)
  *H01L 43/08* (2006.01)
  *H01L 27/22* (2006.01)
  *G11C 11/16* (2006.01)
  *H01L 43/02* (2006.01)

(52) U.S. Cl.
  CPC .............. *H01L 43/12* (2013.01); *G11C 11/161* (2013.01); *H01L 27/224* (2013.01); *H01L 43/02* (2013.01); *H01L 43/08* (2013.01)

(58) Field of Classification Search
  CPC .......... H01L 43/12; H01L 43/02; H01L 43/08; H01L 27/224; G11C 11/161
  See application file for complete search history.

(56) References Cited

U.S. PATENT DOCUMENTS

| | | |
|---|---|---|
| 6,544,801 B1 | 4/2003 | Slaughter et al. |
| 7,449,345 B2 | 11/2008 | Horng et al. |
| 7,479,394 B2 | 1/2009 | Horng et al. |
| 7,598,579 B2 | 10/2009 | Horng et al. |
| 8,138,561 B2 | 3/2012 | Horng et al. |
| 9,028,910 B2 | 5/2015 | Zhou et al. |
| 9,627,609 B2 | 4/2017 | Jeong |
| 2009/0229111 A1* | 9/2009 | Zhao ............... B82Y 10/00 29/603.08 |
| 2018/0149527 A1 | 5/2018 | Lu et al. |

* cited by examiner

*Primary Examiner* — Matthew L Reames
(74) *Attorney, Agent, or Firm* — Lee IP Law, PC

(57) ABSTRACT

A method of fabricating a semiconductor device includes forming a magnetic tunnel junction layer including a first magnetic layer, a second magnetic layer, and a tunnel barrier layer interposed between the first and second magnetic layers, patterning the magnetic tunnel junction layer to form a magnetic tunnel junction pattern, forming an insulating layer to cover the magnetic tunnel junction pattern, and performing a thermal treatment process to crystallize at least a portion of the first and second magnetic layers. The thermal treatment process may include performing a first thermal treatment process at a first temperature, after the forming of the magnetic tunnel junction layer, and performing a second thermal treatment process at a second temperature, which is higher than or equal to the first temperature, after the forming of the insulating layer.

20 Claims, 12 Drawing Sheets

METHOD OF FABRICATING SEMICONDUCTOR DEVICE

CROSS-REFERENCE TO RELATED APPLICATION

Korean Patent Application No. 10-2018-0113513, filed on Sep. 21, 2018, in the Korean Intellectual Property Office, and entitled: "Method of Fabricating Semiconductor Device," is incorporated by reference herein in its entirety.

BACKGROUND

1. Field

Embodiments relate to a method of fabricating a semiconductor device.

2. Description of the Related Art

With increasing demand for electronic devices with increased speed and/or reduced power consumption, there is a desire for semiconductor memory devices with faster operating speeds and/or lower operating voltages.

SUMMARY

Embodiments are directed to a method of fabricating a semiconductor device, the method including forming a magnetic tunnel junction layer on a substrate, the magnetic tunnel junction layer including a first magnetic layer, a second magnetic layer, and a tunnel barrier layer interposed between the first and second magnetic layers, the tunnel barrier layer including an amorphous material, patterning the magnetic tunnel junction layer to form a magnetic tunnel junction including a first magnetic pattern, a second magnetic pattern, and a tunnel barrier pattern interposed between the first magnetic pattern and the second magnetic pattern, forming an insulating layer to cover the magnetic tunnel junction, and performing a thermal treatment process to crystallize at least a portion of the magnetic layers. The thermal treatment process may include performing a first thermal treatment process after the forming of the magnetic tunnel junction layer and performing a second thermal treatment process after the forming of the insulating layer. The second thermal treatment process may be performed at a temperature higher than that in the first thermal treatment process.

Embodiments may provide a method of fabricating a semiconductor device, the method including forming a magnetic tunnel junction layer on a substrate, the magnetic tunnel junction layer including a first magnetic layer, a second magnetic layer, and a tunnel barrier layer interposed between the first and second magnetic layers, the tunnel barrier layer including an amorphous material, forming a top electrode on the magnetic tunnel junction layer, patterning the magnetic tunnel junction layer using the top electrode as a mask to form a magnetic tunnel junction including a first magnetic pattern, a second magnetic pattern, and a tunnel barrier pattern interposed between the first magnetic pattern and the second magnetic pattern, forming an insulating layer on the magnetic tunnel junction and the top electrode to cover the magnetic tunnel junction and the top electrode, forming a through hole to penetrate the insulating layer and to expose the top electrode, and performing a thermal treatment process on the substrate, on which the top electrode exposed by the through hole is provided. The thermal treatment process may be performed at a temperature of about 300° C. to about 400° C.

BRIEF DESCRIPTION OF THE DRAWINGS

Features will become apparent to those of skill in the art by describing in detail example embodiments with reference to the attached drawings in which.

DETAILED DESCRIPTION

Figure 1:
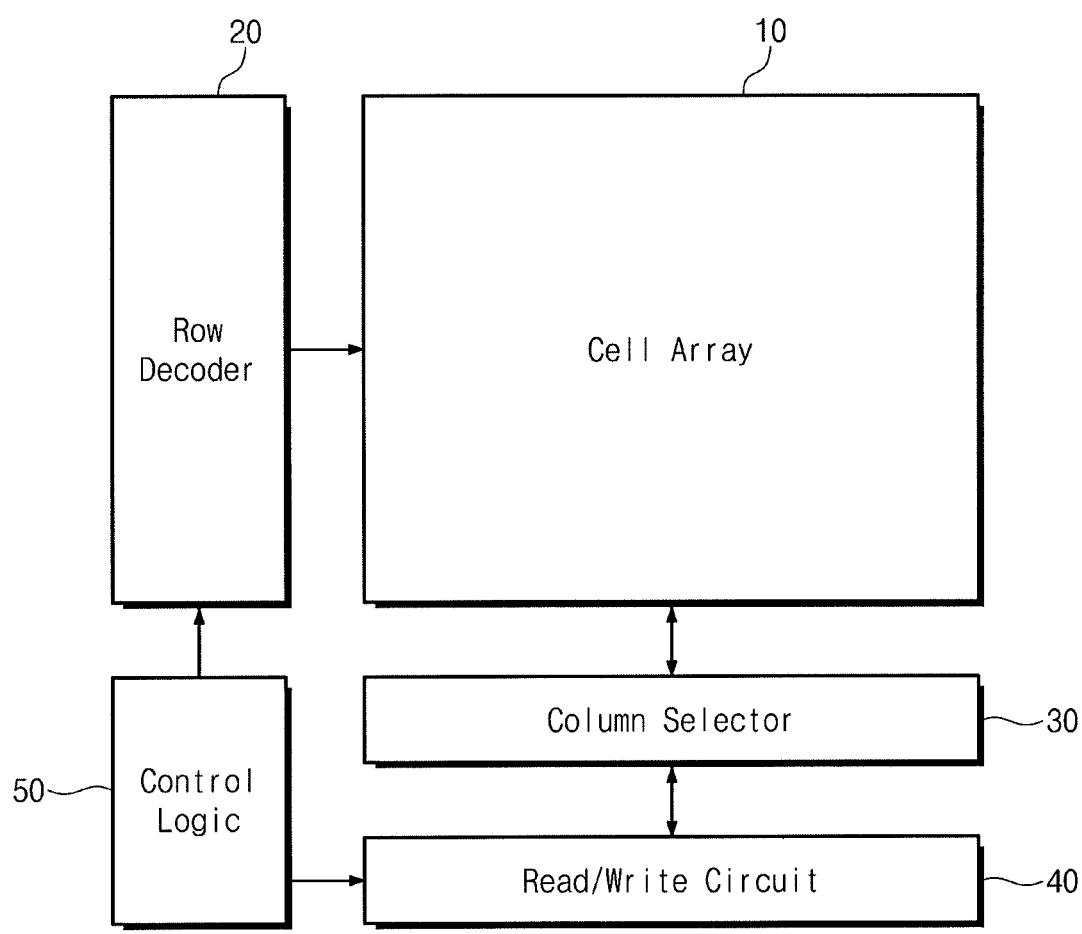
FIG. 1 illustrates a block diagram of a magnetic memory device according to an example embodiment.

FIG. 1 is a block diagram illustrating a magnetic memory device according to an example embodiment.

Referring to FIG. 1, a magnetic memory device may include a memory cell array 10, a row decoder 20, a column selection circuit 30, a read/write circuit 40, and a control logic 50.

The memory cell array 10 may include a plurality of word lines, a plurality of bit lines, and a plurality of memory cells, which are respectively provided at intersection points of the word and bit lines. The structure of the memory cell array 10 will be described in more detail with reference to FIG. 2.

The row decoder 20 may be connected to the memory cell array 10 through the word lines. The row decoder 20 may be configured to decode address information transmitted from the outside and to select one of the word lines, based on the decoded address information.

The column selection circuit 30 may be connected to the memory cell array 10 through the bit lines and may be configured to decode address information input from the outside and to select one of the bit lines, based on the decoded address information. The bit line selected by the column selection circuit 30 may be connected to the read/write circuit 40.

The read/write circuit 40 may provide a bit line bias for accessing to the memory cell, which is selected under control of the control logic 50. The read/write circuit 40 may provide the bit line voltage to the bit line, which is selected to write or read input data to or from the memory cell.

The control logic 50 may output control signals, which are used to control the semiconductor memory device, according to command signals provided from the outside. For example, the control signals output from the control logic 50 may be used to control the read/write circuit 40.

Figure 2:
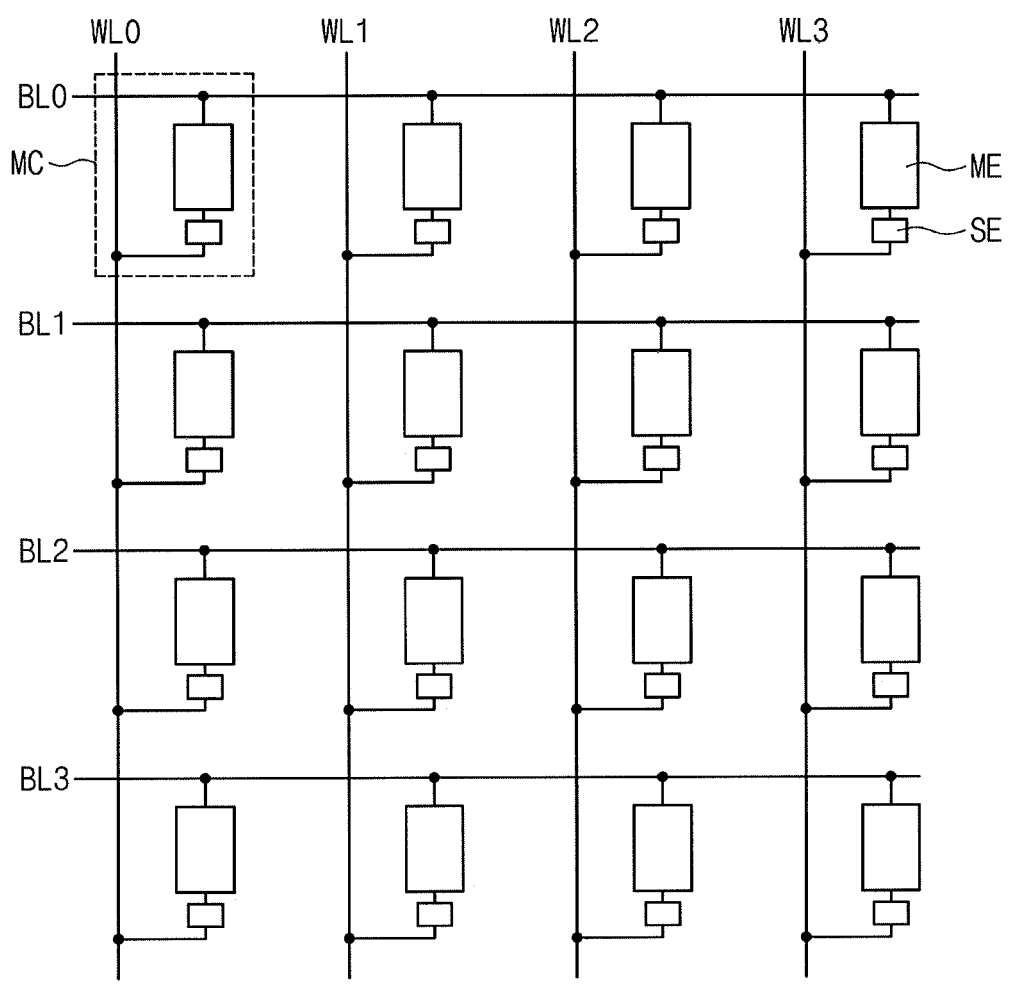
FIG. 2 illustrates a circuit diagram of a memory cell array of a magnetic memory device according to an example embodiment.
Figure 3:
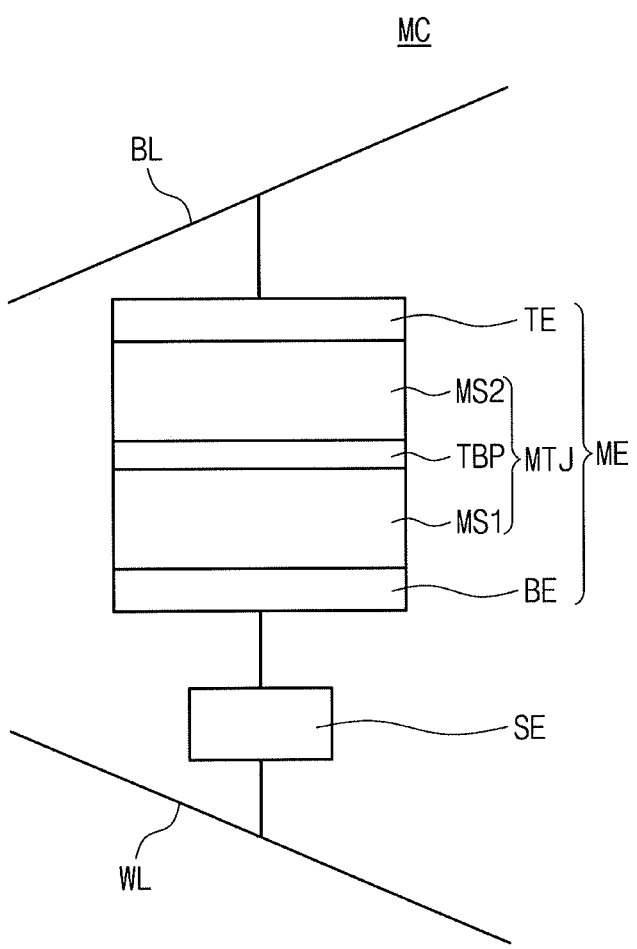
FIG. 3 illustrates a circuit diagram of a unit memory cell of a magnetic memory device according to an example embodiment.

FIG. 2 is a circuit diagram illustrating a memory cell array of a magnetic memory device according to an example embodiment, and FIG. 3 is a circuit diagram illustrating a unit memory cell of a magnetic memory device according to an example embodiment.

Referring to FIG. 2, the memory cell array 10 may include a plurality of first conductive lines, a plurality of second conductive lines, and a plurality of unit memory cells MC. The first conductive lines may be word lines WL0-WL3, and the second conductive lines may be bit lines BL0-BL3. The unit memory cells MC may be two- or three-dimensionally arranged. The word lines WL0-WL3 and the bit lines BL0-BL3 may be provided to cross each other, and each of the unit memory cells MC may be placed at a corresponding one of intersection points between the word lines WL0-WL3 and the bit lines BL0-BL3. Each of the word lines WL0-WL3 may be connected to a plurality of the unit memory cells MC. A plurality of the unit memory cells MC connected to each of the word lines WL0-WL3 may be connected to the bit lines BL0-BL3, respectively, and a plurality of the unit memory cells MC connected to each of the bit lines BL0-BL3 may be connected to the word lines WL0-WL3, respectively. The unit memory cells MC connected by each of the word line WL0-WL3 may be connected to the read/write circuit 40, which was described with reference to FIG. 1, through the bit lines BL0-BL3.

Referring to FIGS. 2 and 3, each of the unit memory cells MC may include a memory element ME and a selection element SE. The memory element ME may be provided between and connected to the selection element SE and a bit line BL, which may be one of the bit lines BL0-BL3 of FIG. 2, and the selection element SE may be provided between and connected to the memory element ME and a word line WL, which may be one of the word lines WL0-WL3 of FIG. 2. The memory element ME may be a variable resistance device, whose resistance can be switched to one of at least two states by an electric pulse applied thereto.

In an example embodiment, the memory element ME may be formed to have a layered structure, whose electric resistance can by changed by a spin transfer process using an electric current passing therethrough. For example, the memory element ME may have a layered structure, which is configured to exhibit a magnetoresistance property, and may include at least one ferromagnetic material and/or at least one antiferromagnetic material.

The selection element SE may be configured to selectively control a current flow of an electric current passing through the memory element ME. As an example, the selection element SE may be one of a diode, a pnp bipolar transistor, an npn bipolar transistor, an NMOS field effect transistor, and a PMOS field effect transistor. In the case where the selection element SE is a three-terminal device (e.g., a bipolar transistor or a MOS field effect transistor), an additional interconnection line may be connected to the selection element SE.

The memory element ME may include a first magnetic pattern MS1, a second magnetic pattern MS2, and a tunnel barrier pattern TBP interposed therebetween. The first magnetic pattern MS1, the second magnetic pattern MS2, and the tunnel barrier pattern TBP may constitute a magnetic tunnel junction MTJ. Each of the first and second magnetic patterns MS1 and MS2 may include at least one magnetic layer made of a magnetic material. The memory element ME may include a bottom electrode BE interposed between the second magnetic pattern MS2 and the selection element SE and a top electrode TE interposed between the first magnetic pattern MS1 and the bit line BL.

Figure 4:
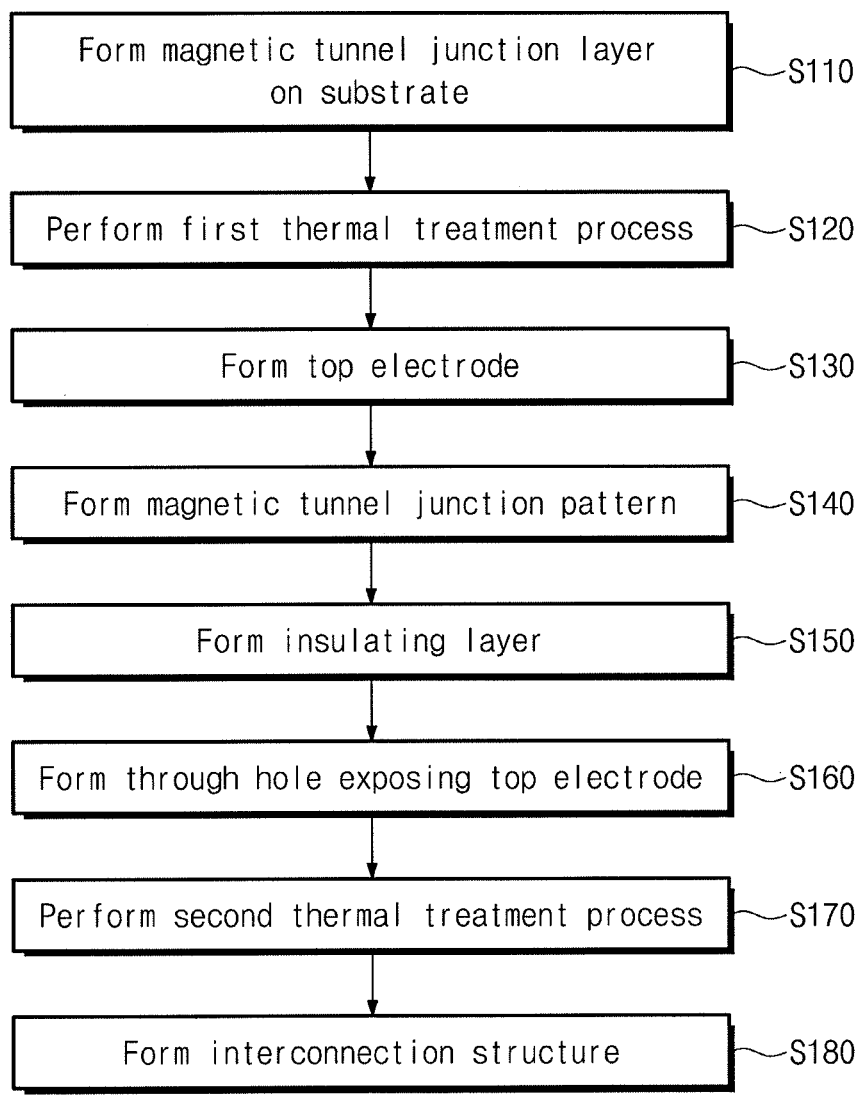
FIG. 4 illustrates a flow chart of a method of fabricating a magnetic memory device, according to an example embodiment.

FIG. 4 is a flow chart illustrating a method of fabricating a magnetic memory device, according to an example embodiment. FIGS. 5A to 5G are sectional views illustrating stages in a process of fabricating the magnetic memory device of FIG. 4.

Figure 5A:
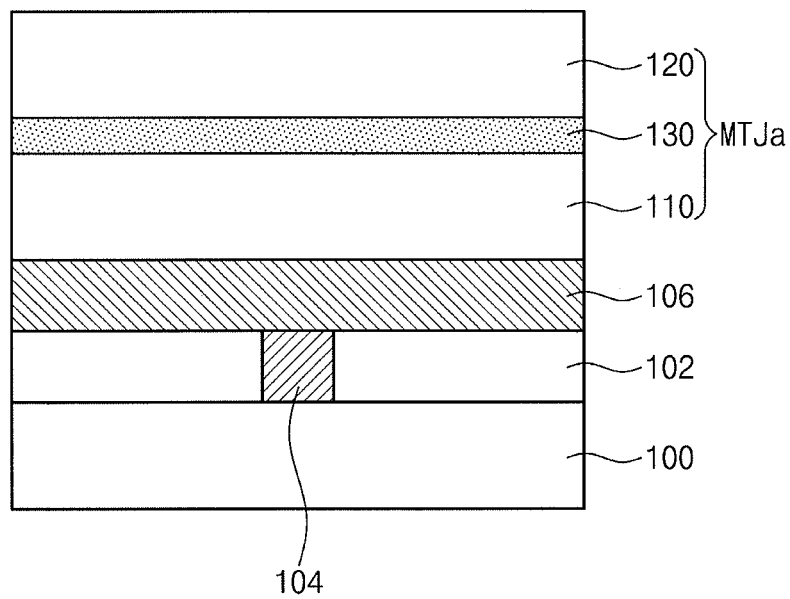
FIGS. 5A to 5G illustrate sectional views of stages in a process of fabricating the magnetic memory device of FIG. 4.

Referring to FIGS. 4 and 5A, a magnetic tunnel junction layer MTJa may be formed on a substrate 100 (S110) and a lower interlayer insulating layer 102 may be formed on the substrate 100. The substrate 100 may include a semiconductor substrate. For example, the substrate 100 may include a silicon substrate, a germanium substrate, a silicon-germanium substrate, etc. In an example embodiment, the selection elements may be formed on the substrate 100, and the lower interlayer insulating layer 102 may be formed to cover the selection elements. The selection elements may be, e.g., field effect transistors, diodes, etc. The lower interlayer insulating layer 102 may have a single- or multi-layered structure including, e.g., one or more of an oxide, nitride, or oxynitride. A lower contact plug 104 may be formed in the lower interlayer insulating layer 102. The lower contact plug 104 may be formed to penetrate the lower interlayer insulating layer 102 and may be electrically coupled to a terminal of a corresponding one of the selection elements. In an example embodiment, the lower contact plug 104 may have a top surface that is substantially coplanar with that of the lower interlayer insulating layer 102. The lower contact plug 104 may include. e.g., one or more of doped semiconductor materials (e.g., doped silicon), metals (e.g., tungsten, titanium, and/or tantalum), conductive metal nitrides (e.g., titanium nitride, tantalum nitride, and/or tungsten nitride), or metal-semiconductor compounds (e.g., metal silicide).

A bottom electrode layer 106 may be formed on the lower interlayer insulating layer 102. The bottom electrode layer 106 may be formed of or include, e.g., one or more of conductive metal nitrides (e.g., titanium nitride and tantalum nitride). The bottom electrode layer 106 may include a material (e.g., ruthenium (Ru)) helping magnetic layers thereon to be grown in a crystalline structure. The bottom electrode layer 106 may be formed by, e.g., a sputtering process, a chemical vapor deposition process, or an atomic layer deposition process.

The magnetic tunnel junction layer MTJa may be formed on the bottom electrode layer 106. The magnetic tunnel junction layer MTJa may include a first magnetic layer 120, a second magnetic layer 110, and a tunnel barrier layer 130 interposed between the first magnetic layer 120 and the second magnetic layer 110. In an example embodiment, the second magnetic layer 110, the tunnel barrier layer 130, and the first magnetic layer 120 may be sequentially formed on the bottom electrode layer 106.

The second magnetic layer 110 may include at least one fixed layer having a fixed magnetization direction. As an example, the magnetization direction of the fixed layer may be substantially perpendicular to an interface between the tunnel barrier layer 130 and the second magnetic layer 110. In this case, the fixed layer may include, e.g., one or more of perpendicular magnetic materials (e.g., CoFeTb, CoFeGd, and CoFeDy), $L1_0$ perpendicular magnetic materials, CoPt-based materials with hexagonal-close-packed structure, and perpendicular magnetic structures. The $L1_0$ perpendicular magnetic materials may include, e.g., one or more of $L1_0$ FePt, $L1_0$ FePd, $L1_0$ CoPd, or $L1_0$ CoPt. The perpendicular magnetic structures may include magnetic layers and non-magnetic layers that are alternately and repeatedly stacked. For example, the perpendicular magnetic structure may include, e.g., one or more of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers. In an example embodiment, the magnetization direction of the fixed layer may be substantially parallel to the interface between the tunnel barrier layer 130 and the second magnetic layer 110. In this case, the fixed layer may be formed of or include a ferromagnetic material. The fixed layer may further include an antiferromagnetic material fixing a magnetization direction of the ferromagnetic material in the fixed layer.

The tunnel barrier layer 130 may include, e.g., one or more of magnesium oxide, titanium oxide, aluminum oxide, magnesium-zinc oxide, or magnesium-boron oxide. As an example, the tunnel barrier layer 130 may be a magnesium oxide (MgO) layer. In an implementation, the tunnel barrier layer 130 may include a plurality of layers, and each of the layers constituting the tunnel barrier layer 130 may be formed of or include, e.g., one or more of magnesium oxide, titanium oxide, aluminum oxide, magnesium-zinc oxide, magnesium-boron oxide, titanium nitride, or vanadium nitride.

The first magnetic layer 120 may be a free layer, whose magnetization direction can be changed to be parallel or anti-parallel to the fixed magnetization direction of the fixed layer. The first magnetic layer 120 may include a magnetic material exhibiting the intrinsic in-plane magnetization property. The intrinsic in-plane magnetization property may be realized by using a single- or multi-layered structure, in which at least one of cobalt (Co), iron (Fe), and alloys thereof is contained. In an example embodiment, the first magnetic layer 120 may contain cobalt (Co), iron (Fe), and a first nonmetallic element. The first nonmetallic element may be, e.g., boron (B). For example, the first magnetic layer 120 may be a single-layered structure of CoFeB. As an example, the first magnetic layer 120 may be formed to have a magnetization direction that is substantially perpendicular to an interface between the tunnel barrier layer 130 and the first magnetic layer 120.

Each of the first magnetic layer 120, the tunnel barrier layer 130, and the second magnetic layer 110 may be formed by, e.g., an atomic layer deposition method, a physical vapor deposition method, or a chemical vapor deposition method. An oxide layer and/or a capping layer may be additionally formed on the first magnetic layer 120.

Figure 5B:
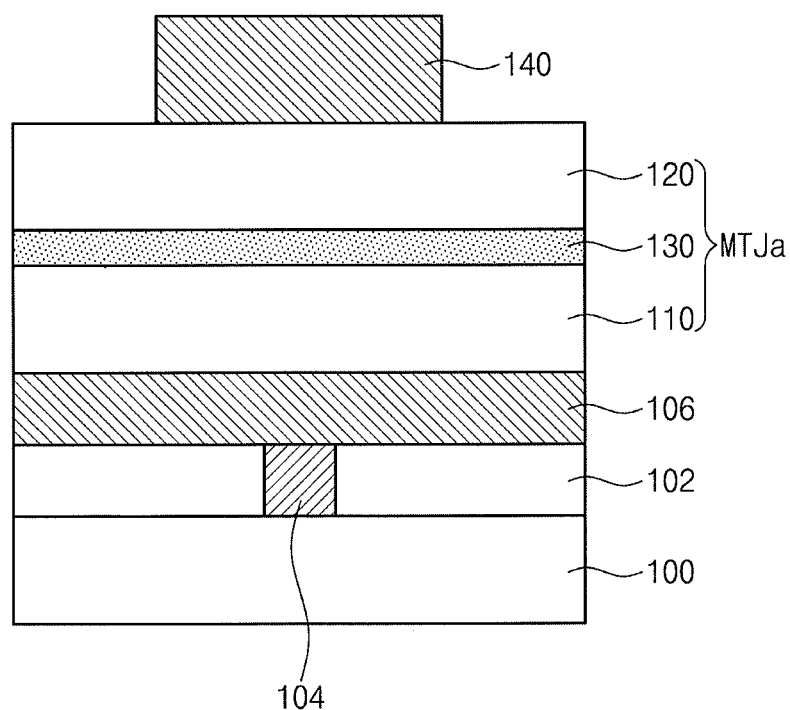

Referring to FIGS. 4 and 5B, a first thermal treatment process may be performed (S120). The first thermal treatment process may be performed on the substrate 100 provided with the magnetic tunnel junction layer MTJa. The first thermal treatment process may be performed to heat the substrate 100 to a first temperature. The first temperature may be from about 250° C. to about 300° C. For example, the first temperature may be about 300° C.

Figure 7:
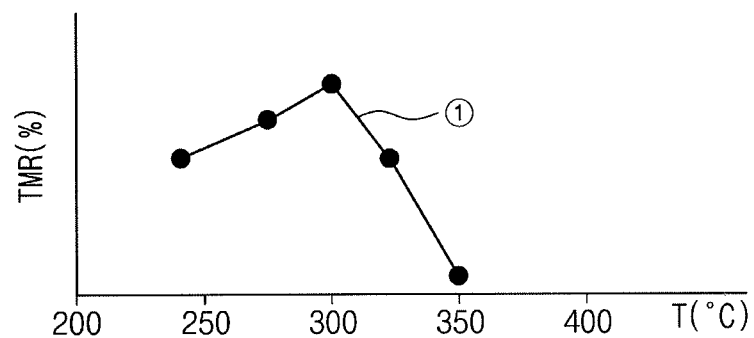
FIG. 7 illustrates a graph showing a relationship between a tunnel magnetoresistance ratio of a magnetic tunnel junction and a process temperature of a thermal treatment process.

FIG. 7 is a graph showing a relationship between a tunnel magnetoresistance (TMR) ratio of a magnetic tunnel junction and a process temperature of a thermal treatment process. Referring to FIG. 7, curve (1) shows tunnel magnetoresistance ratios measured from magnetic tunnel junctions with different chemical contents. As shown in the curve (1) of FIG. 7, the tunnel magnetoresistance ratios were reduced at temperature higher than about 300° C. As an example, in the case where the thermal treatment process is performed at a process temperature of 300° C. or higher, a side effect such as ion diffusion between magnetic layers may lead to deterioration in synthetic antiferromagnetic (SAF) coupling of a magnetic tunnel junction and reduction in tunnel magnetoresistance of a magnetic tunnel junction.

At least a portion of the first and second magnetic layers 110 and 120 may be crystallized by the first thermal treatment process. As an example, during the first thermal treatment process, boron atoms in the first magnetic layer 120 may be diffused to neighboring layers. For example, during the first thermal treatment process, boron atoms in the first magnetic layer 120 may be diffused into the tunnel barrier layer 130. Thus, at least a portion of the first magnetic layer 120 may be crystallized. For example, at least a portion of the first magnetic layer 120 may be recrystallized. As a result of the first thermal treatment process, iron atoms in the first magnetic layer 120 may be bonded to oxygen atoms in the tunnel barrier layer 130 at an interface between the first magnetic layer 120 and the tunnel barrier layer 130, and in this case, an interface perpendicular magnetic anisotropy may be induced at the interface between the first magnetic layer 120 and the tunnel barrier layer 130.

Referring back to FIGS. 4 and 5B, a conductive pattern 140 may be formed on the magnetic tunnel junction layer MTJa (in S130).

In detail, a conductive layer may be formed on the magnetic tunnel junction layer MTJa and may be patterned to form the conductive pattern 140. The conductive pattern 140 may be formed of or include, e.g., one or more of tungsten, titanium, tantalum, aluminum, or metal nitrides (e.g., titanium nitride and tantalum nitride). The conductive pattern 140 may define a position or shape of the magnetic tunnel junction to be formed in a subsequent step. The conductive pattern 140 may serve as the top electrode TE, as will be described below.

Figure 5C:
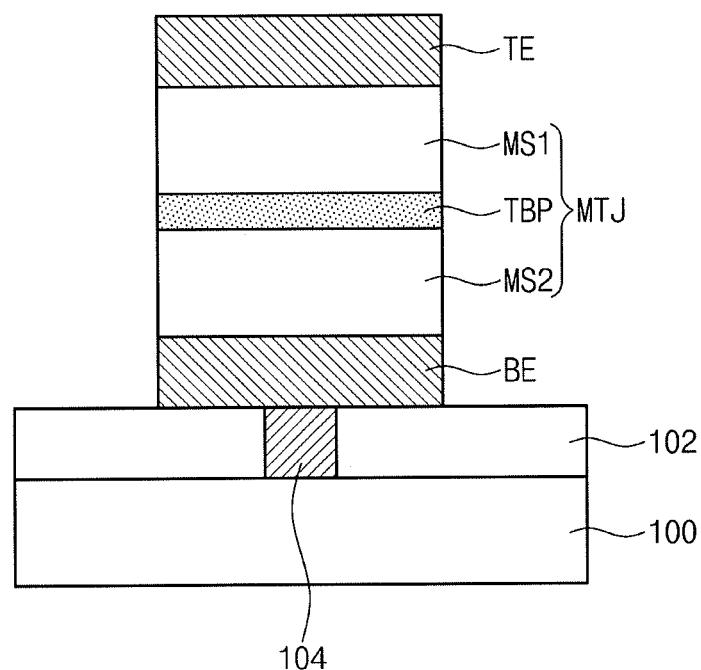

Referring to FIGS. 4 and 5C, the magnetic tunnel junction layer MTJa may be patterned to form a magnetic tunnel junction pattern MTJ (in S140).

The first magnetic layer 120, the tunnel barrier layer 130, the second magnetic layer 110, and the bottom electrode layer 106 may be sequentially etched using the conductive pattern 140 as an etch mask. The etching process may be performed using, e.g., an ion beam etching process. The first magnetic layer 120, the tunnel barrier layer 130, the second magnetic layer 110, and the bottom electrode layer 106 may be sequentially etched to form the first magnetic pattern MS1, the tunnel barrier pattern TBP, the second magnetic pattern MS2, and the bottom electrode BE, respectively. The conductive pattern 140 may serve as the top electrode TE. The first magnetic pattern MS1, the second magnetic pattern MS2, and the tunnel barrier pattern TBP between the first magnetic pattern MS1 and the second magnetic pattern MS2 may constitute the magnetic tunnel junction pattern MTJ. The magnetic tunnel junction pattern MTJ may be formed between the bottom electrode BE and the top electrode TE.

The bottom electrode BE, the magnetic tunnel junction pattern MTJ, and the top electrode TE may have side surfaces aligned to each other. In an example embodiment, the bottom electrode BE, the magnetic tunnel junction pattern MTJ, and the top electrode TE may be formed to have side surfaces that are inclined at an angle to the top surface of the substrate 100.

Figure 5D:
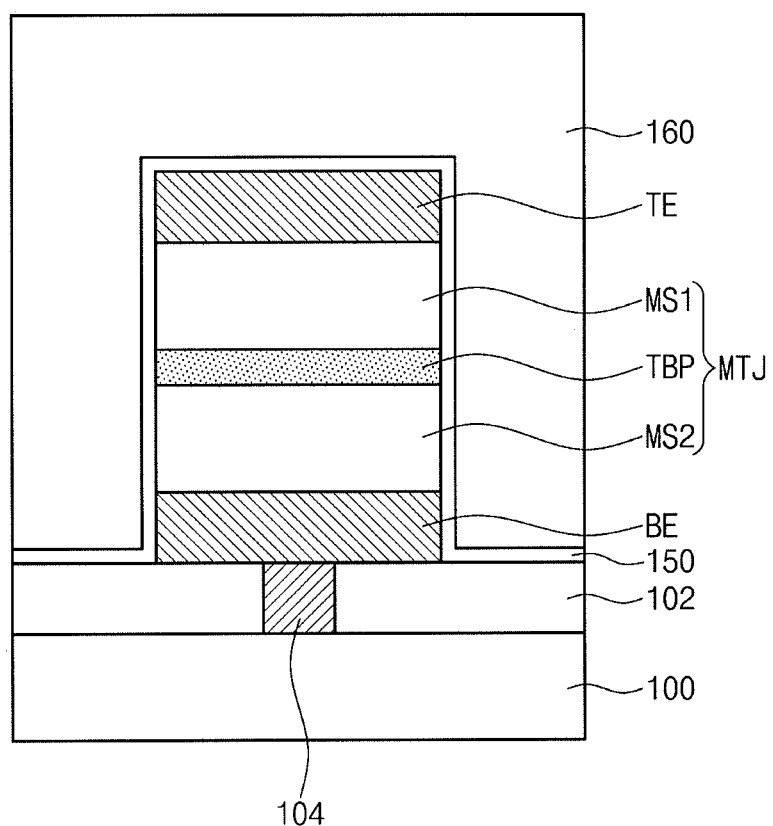

Referring to FIGS. 4 and 5D, an insulating layer, e.g., an upper interlayer insulating layer 160, may be formed on the magnetic tunnel junction pattern MTJ (in S150).

In an example embodiment, a capping layer 150 may be additionally formed on the magnetic tunnel junction pattern MTJ and the lower interlayer insulating layer 102. The capping layer 150 may be formed to cover the magnetic tunnel junction pattern MTJ, the top electrode TE, and the lower interlayer insulating layer 102. The capping layer 150 may be formed of or include, e.g., one or more of metal oxide materials. For example, the capping layer 150 may be formed of or include, e.g., one or more of tantalum oxide, magnesium oxide, titanium oxide, zirconium oxide, hafnium oxide, or zinc oxide.

The upper interlayer insulating layer 160 may be formed on the capping layer 150 to cover the capping layer 150, the magnetic tunnel junction pattern MTJ, and the top electrode TE. The upper interlayer insulating layer 160 may be formed of or include, e.g., one or more of oxide, nitride, and/or oxynitride.

Figure 5E:
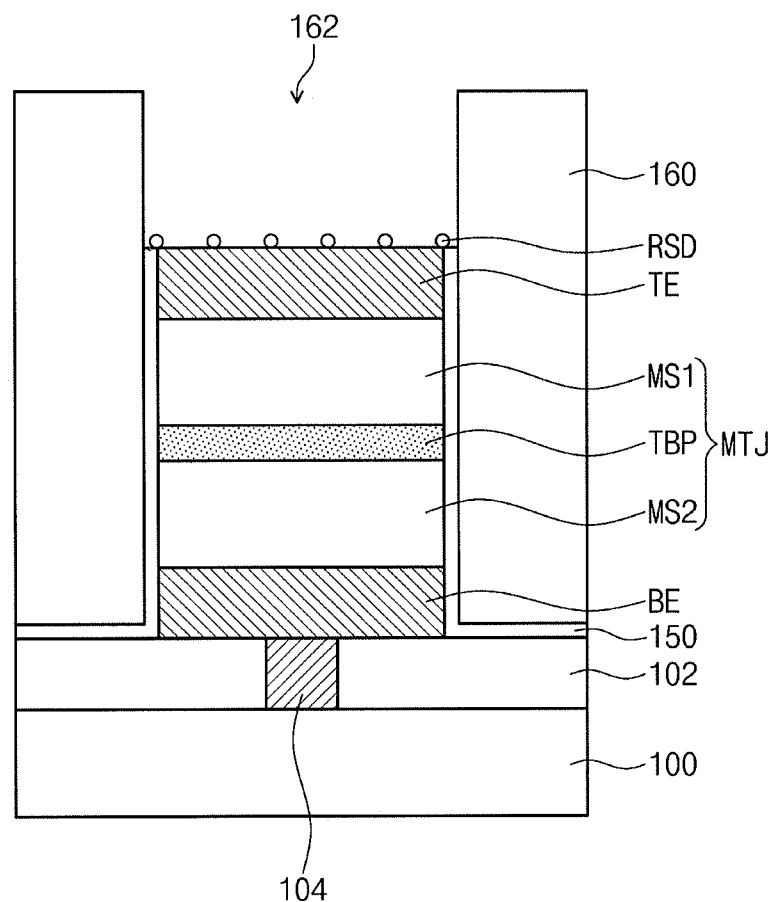

Referring to FIGS. 4 and 5E, a through hole 162 may be formed to penetrate the upper interlayer insulating layer 160 and to expose the top electrode TE (in S160).

The through hole 162 may be formed by etching the upper interlayer insulating layer 160. The through hole 162 may be formed to fully expose a top surface of the top electrode TE. The through hole 162 may expose the top electrode TE as well as portions of the capping layer 150 covering the side surface of the top electrode TE. After the formation of the through hole 162, a residue RSD may remain on the top electrode TE in the through hole 162. The residue RSD may remain on an inner side surface of the through hole 162 (e.g., the exposed side surface of the upper interlayer insulating layer 160). The residue RSD may be a residual material that is not removed even after etching the upper interlayer insulating layer 160. The residue RSD may include HF, $H_2$, $H_2O$, etc.

Figure 5F:
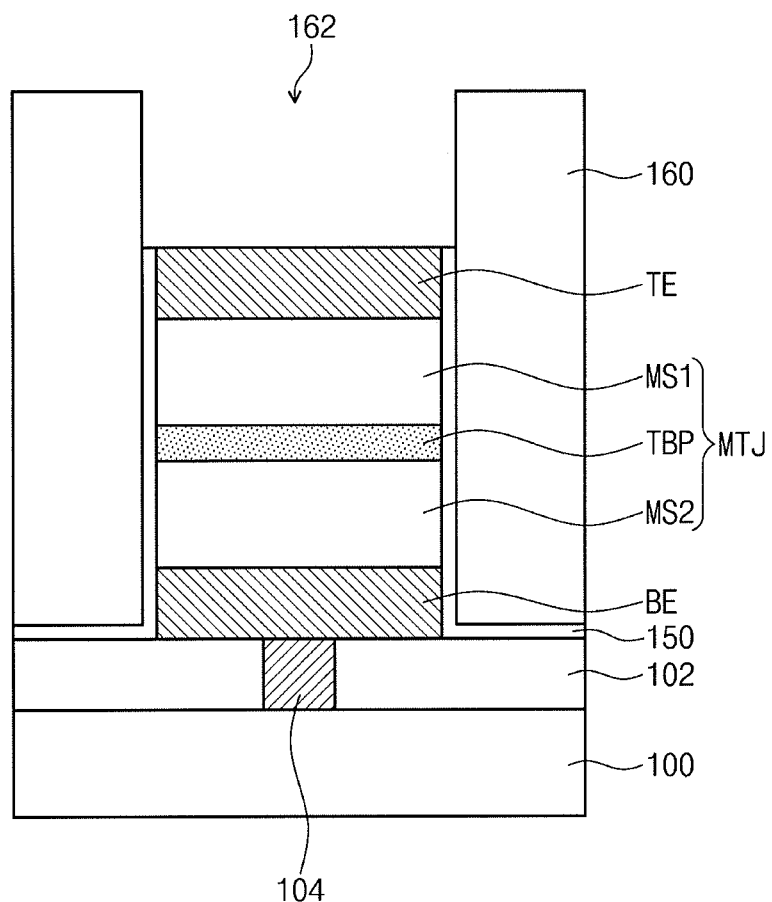

Referring to FIGS. 4 and 5F, a second thermal treatment process may be performed (in S170).

The second thermal treatment process may be performed on the substrate 100, on which the magnetic tunnel junction pattern MTJ and the upper interlayer insulating layer 160 covering the same are formed. The second thermal treatment process may be performed to heat the substrate 100 to a second temperature. The second temperature may be higher than or equal to the first temperature. The second temperature may range from about 300° C. to about 400° C. For example, the second temperature may range from 320° C. to 350° C. As described above with reference to FIG. 5B, an upper limit of the temperature of the thermal treatment process may be about 300° C. However, the second temperature higher than the first temperature may be allowed for the second thermal treatment process, because heat energy by the second thermal treatment process is indirectly transferred to the magnetic tunnel junction pattern MTJ through the top electrode TE exposed by the through hole 162 of the upper interlayer insulating layer 160.

At least a portion of the first and second magnetic layers 110 and 120 may be crystallized by the second thermal treatment process. As an example, during the second thermal treatment process, boron atoms in the first magnetic layer 120 may be diffused to neighboring layers. For example, during the second thermal treatment process, boron atoms in the first magnetic layer 120 may be diffused into the tunnel barrier layer 130. Thus, at least a portion of the first magnetic layer 120 may be crystallized. For example, at least a portion of the first magnetic layer 120 may be recrystallized. As a result of the second thermal treatment process, iron atoms in the first magnetic layer 120 may be bonded to oxygen atoms in the tunnel barrier layer 130 at an interface between the first magnetic layer 120 and the tunnel barrier layer 130, and in this case, an interface perpendicular magnetic anisotropy may be induced at the interface between the first magnetic layer 120 and the tunnel barrier layer 130.

A degassing process of removing the residue RSD from the through hole 162 may be performed during the second thermal treatment process. For example, the residue RSD may be outgassed from the through hole 162 through evaporation and so forth. According to an example embodiment, the degassing process and the crystallization process may be concurrently performed.

Thereafter, a cleaning process may be performed on the through hole 162.

As described above, according to an example embodiment, the crystallization of the magnetic tunnel junction layer MTJa may include the two-step thermal treatment process. For example, the first thermal treatment process may be performed after the formation of the magnetic tunnel junction layer MTJa, the upper interlayer insulating layer 160 may be formed to cover the magnetic tunnel junction pattern MTJ, the through hole 162 may be formed to expose the top electrode TE, and then the second thermal treatment process may be performed on the magnetic tunnel junction layer MTJa. In this case, heat energy by the second thermal treatment process may be transferred to the magnetic tunnel junction pattern MTJ indirectly through the top electrode TE, not directly to the magnetic tunnel junction pattern MTJ, and thus the second thermal treatment process may be performed at a process temperature higher than that in the first thermal treatment process. In addition, a degassing process of removing the residue RSD may be performed during the second thermal treatment process. In the case where a magnetic memory device is fabricated through the two-step thermal treatment process, the magnetic memory device may have an improved tunnel magnetoresistance property.

Figure 5G:
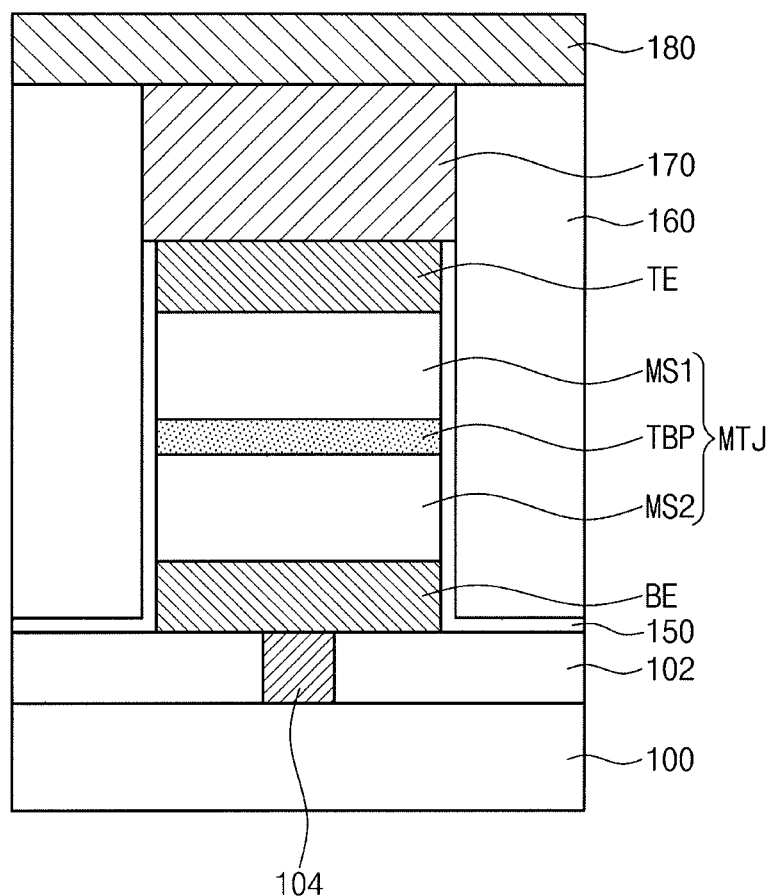

Referring to FIGS. 4 and 5G, an interconnection structure may be formed to fill the through hole 162 (in S180).

The interconnection structure may include a conductive via 170 and an interconnection line 180. The conductive via 170 may be formed to penetrate the upper interlayer insulating layer 160 and to be electrically connected to the top electrode TE. The conductive via 170 may be formed of or include, e.g., one or more of metals (e.g., titanium, tantalum, copper, aluminum, or tungsten) or conductive metal nitrides (e.g., titanium nitride or tantalum nitride). The formation of the conductive via 170 may include forming a barrier layer in the through hole 162, forming a conductive seed layer on the barrier layer, filling the through hole 162 with a conductive material, and performing a planarization process. As an example, the barrier layer may be formed of or include tantalum or tantalum nitride. The conductive seed layer may be formed of or include, e.g., copper. The filling of the through hole 162 may include performing an electroplating process using the conductive seed layer.

The interconnection line 180 may be formed on the upper interlayer insulating layer 160. The interconnection line 180 may be coupled to the conductive via 170. The interconnection line 180 may be formed of or include, e.g., one or more of metals (e.g., titanium, tantalum, copper, aluminum, or tungsten) or conductive metal nitrides (e.g., titanium nitride or tantalum nitride). In an example embodiment, the interconnection line 180 may be used as a bit line of the magnetic memory device.

In an example embodiment, a third thermal treatment process may be further performed on the substrate 100 provided with the interconnection structure (170 and 180). The third thermal treatment process may be performed to heat the substrate 100 to a third temperature. The third temperature may be from 250° C. to about 300° C. The third temperature may be lower than or equal to the second temperature. As an example, the third temperature may be about 300° C. The third thermal treatment process may be a curing process.

Figure 6A:
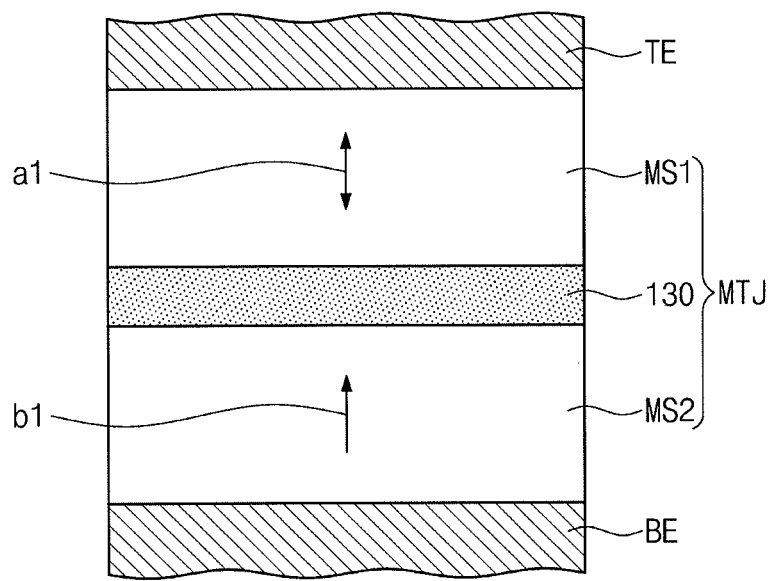
FIG. 6A illustrates a sectional view of an example of the magnetic tunnel junction of FIG. 5G.
Figure 6B:
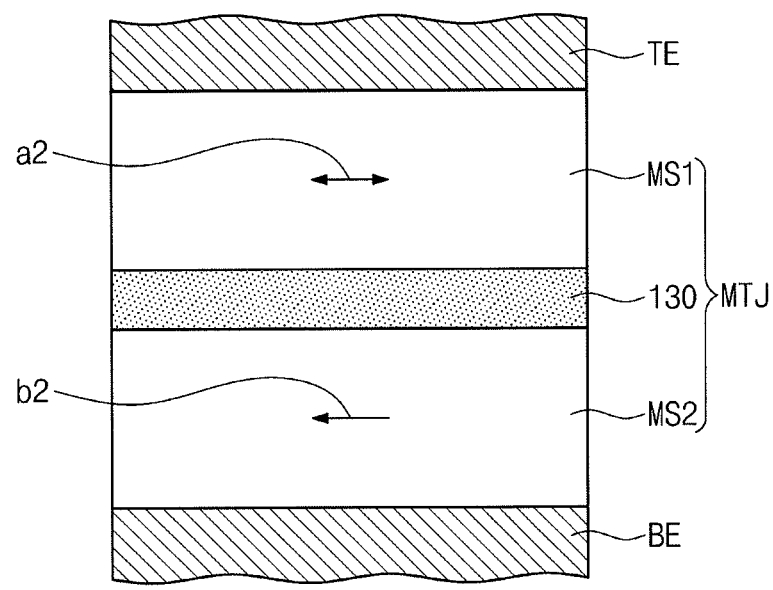
FIG. 6B illustrates a sectional view of another example of the magnetic tunnel junction of FIG. 5G.

FIG. 6A is a sectional view illustrating an example of the magnetic tunnel junction of FIG. 5G, and FIG. 6B is a sectional view illustrating another example of the magnetic tunnel junction of FIG. 5G.

As an example, as shown in FIG. 6A, the first magnetic pattern MS1 may be a free layer with a switchable magnetization direction a1. The second magnetic pattern MS2 may include at least one fixed layer having a fixed magnetization direction b1. The magnetization directions a1 and b1 may be substantially perpendicular to an interface surface between the first magnetic pattern MS1 and the tunnel barrier pattern TBP.

Although the first magnetic pattern MS1 exhibits the in-plane magnetization property intrinsically, the magnetization direction of the first magnetic pattern MS1 may be changed from an in-plane magnetization direction to a perpendicular magnetization direction by an external cause. Thus, the first magnetic pattern MS1 may exhibit an extrinsic perpendicular magnetization property, if there is the external cause. In detail, the first magnetic pattern MS1 may be in contact with the tunnel barrier pattern TBP, and such a contact between the first magnetic pattern MS1 and the tunnel barrier pattern TBP may induce a magnetic anisotropy, allowing the first magnetic pattern MS1 to have the extrinsic perpendicular magnetization property. As an example, in the case where the tunnel barrier pattern TBP includes MgO and the first magnetic pattern MS1 includes CoFeB, the magnetic anisotropy may be caused by bonds between oxygen atoms in the tunnel barrier pattern TBP and iron atoms in the first magnetic pattern MS1.

The second magnetic pattern MS2 may include at least one fixed layer having a perpendicular magnetization direction b1. The fixed layer may include, e.g., one or more of perpendicular magnetic materials (e.g., CoFeTb, CoFeGd, and CoFeDy), $L1_0$ perpendicular magnetic materials, CoPt-based materials with hexagonal-close-packed structure, and perpendicular magnetic structures. The $L1_0$ perpendicular magnetic materials may include, e.g., one or more of $L1_0$ FePt, $L1_0$ FePd, $L1_0$ CoPd, or $L1_0$ CoPt. The perpendicular magnetic structures may include magnetic layers and non-magnetic layers that are alternately and repeatedly stacked. For example, the perpendicular magnetic structure may include, e.g., one or more of (Co/Pt)n, (CoFe/Pt)n, (CoFe/Pd)n, (Co/Pd)n, (Co/Ni)n, (CoNi/Pt)n, (CoCr/Pt)n or (CoCr/Pd)n, where n is the number of stacked pairs of the layers.

As another example, as shown in FIG. 6B, the first magnetic pattern MS1 may be a free layer with a switchable magnetization direction a2. The second magnetic pattern MS2 may include at least one fixed layer having a fixed magnetization direction b2. The magnetization directions a2 and b2 may be substantially parallel to a surface, at which the first magnetic pattern MS1 and the tunnel barrier pattern TBP are in contact with each other. In this case, the first magnetic pattern MS1 may be formed to have a thickness, allowing it to have the in-plane magnetization direction a2. The second magnetic pattern MS2 may include at least one fixed layer having an in-plane magnetization direction b2. The fixed layer may include a ferromagnetic material and may further include an antiferromagnetic material for fixing a magnetization direction of the ferromagnetic material.

Figure 8:
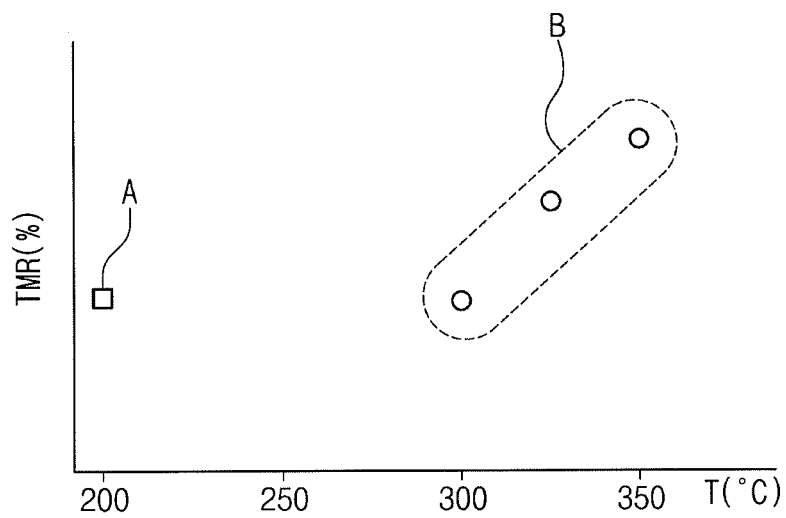
FIG. 8 illustrates a graph showing tunnel magnetoresistance ratios of magnetic tunnel junctions according to some embodiments of the inventive concept and a comparative example.

FIG. 8 is a graph showing tunnel magnetoresistance ratios of magnetic tunnel junctions according to some example embodiments and a comparative example. The reference character A (comparative example) shows a tunnel magnetoresistance ratio measured when the degassing process was performed at a low temperature (e.g., about 200° C.). The reference character B (example embodiment) shows tunnel magnetoresistance ratios measured when the second annealing process was performed. FIG. 8 shows that when the second annealing process is performed at a temperature ranging from about 320° C. to about 350° C., the magnetic tunnel junction may have an improved tunnel magnetoresistance property, compared to the comparative example.

The above described fabrication method may be variously modified to realize various semiconductor devices (e.g., DRAM), in which a local heating process is required. In addition, the degassing process of removing by-products may also be performed, along with the second thermal treatment process. Furthermore, in the above described embodiments, an example has been described in which the second thermal treatment process is performed on the top electrode with a fully exposed top surface, but the second thermal treatment process may be performed on a top electrode with a partially exposed top surface. With regard to the direct and indirect annealing processes (i.e., the first and second thermal treatment processes), example ranges on the process temperatures have been described, but the process temperatures may be variously changed, depending on technical details of the semiconductor device.

By way of summation and review, in a magnetic memory device that includes a magnetic tunnel junction (MTJ) pattern, the MTJ pattern may include two magnetic layers and an insulating layer interposed therebetween. Resistance of the MTJ pattern can be varied depending on magnetization directions of the magnetic layers, e.g., the resistance of the MTJ pattern is higher when magnetization directions of the magnetic layers are anti-parallel to each other than when they are parallel to each other, and the difference in resistance can be used for data storing/reading operations of the magnetic memory device. A magnetic memory device may exhibit high speed and/or non-volatility.

As described above, embodiments relate to a method of fabricating a magnetic memory device including a magnetic tunnel junction.

Embodiments may provide a magnetic memory device with an improved tunnel magnetoresistance property. Embodiments may provide a method of fabricating a highly reliable semiconductor device. Embodiments may provide a magnetic memory device with high integration density and low power consumption properties. Embodiments may provide a method of fabricating a magnetic memory device with an improved tunnel magnetoresistance property.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of fabricating a semiconductor device, the method comprising:

forming a magnetic tunnel junction layer including a first magnetic layer, a second magnetic layer, and a tunnel barrier layer interposed between the first and second magnetic layers;

patterning the magnetic tunnel junction layer to form a magnetic tunnel junction pattern;

forming an insulating layer to cover the magnetic tunnel junction pattern; and performing a thermal treatment process to crystallize at least a portion of the first and second magnetic layers, the thermal treatment process including:

performing a first thermal treatment process at a first temperature, after the forming of the magnetic tunnel junction layer; and performing a second thermal treatment process at a second temperature, which is higher than or equal to the first temperature, after the forming of the insulating layer.

2. The method as claimed in claim 1, wherein the first temperature is from about 250° C. to about 300° C., and the second temperature is from about 300° C. to about 400° C., provided that the second temperature is higher than or equal to the first temperature.

3. The method as claimed in claim 1, further comprising forming a top electrode on the magnetic tunnel junction layer, wherein:

the patterning of the magnetic tunnel junction layer is performed using the top electrode as a mask, and the insulating layer is formed to cover the top electrode and the magnetic tunnel junction pattern.

4. The method as claimed in claim 3, wherein the second thermal treatment process is performed after forming a through hole penetrating the insulating layer and exposing the top electrode.

5. The method as claimed in claim 4, wherein a degassing process of removing a residue from the through hole is performed concurrently when the second thermal treatment process is performed.

6. The method as claimed in claim 4, further comprising forming an interconnection structure to fill the through hole after the performing of the second thermal treatment process.

7. The method as claimed in claim 6, wherein the forming of the interconnection structure includes:

forming a conductive via to fill the through hole; and forming a conductive line on the insulating layer and the conductive via to be electrically connected to the conductive via.

8. The method as claimed in claim 7, wherein the forming of the conductive via includes:

forming a barrier layer in the through hole;

forming a conductive seed layer on the barrier layer; and forming the conductive via to fill the through hole using the conductive seed layer.

9. The method as claimed in claim 6, further comprising performing a third thermal treatment process at a third temperature after the forming of the interconnection structure, wherein the third temperature is lower than or equal to the second temperature.

10. The method as claimed in claim 9, wherein the third temperature ranges from about 250° C. to about 300° C.

11. The method as claimed in claim 4, further comprising forming a capping layer to cover the magnetic tunnel junction pattern and the top electrode, after the patterning of the magnetic tunnel junction layer and before the forming of the insulating layer.

12. The method as claimed in claim 11, wherein the through hole is formed to expose the magnetic tunnel junction pattern and at least a portion of the capping layer covering a side surface of the top electrode.

13. The method as claimed in claim 4, wherein the through hole is formed to fully expose a top surface of the top electrode.

14. A method of fabricating a semiconductor device, the method comprising:

forming a magnetic tunnel junction layer on a substrate, the magnetic tunnel junction layer including a first magnetic layer, a second magnetic layer, and a tunnel barrier layer between the first magnetic layer and the second magnetic layer;

forming a top electrode on the magnetic tunnel junction layer;

patterning the magnetic tunnel junction layer using the top electrode as a mask to form a magnetic tunnel junction pattern;

forming an insulating layer on the magnetic tunnel junction pattern and the top electrode;

forming a through hole to penetrate the insulating layer and to expose the top electrode; and performing a thermal treatment process on the substrate, on which the top electrode exposed by the through hole is provided, wherein the thermal treatment process is performed at a temperature of about 300° C. to about 400° C.

15. The method as claimed in claim 14, wherein a degassing process of removing a residue from the through hole is performed concurrently when the thermal treatment process is performed.

16. The method as claimed in claim 14, wherein the thermal treatment process is a second thermal treatment process, the method further comprises performing a first thermal treatment process on the substrate provided with the magnetic tunnel junction layer, before the patterning of the magnetic tunnel junction layer, and the first thermal treatment process is performed at a temperature lower than that in the second thermal treatment process.

17. The method as claimed in claim 16, wherein the first thermal treatment process is performed at a temperature of about 250° C. to about 300° C.

18. The method as claimed in claim 14, further comprising forming a capping layer to cover the magnetic tunnel junction pattern and the top electrode, after the patterning of the magnetic tunnel junction layer and before the forming of the insulating layer.

19. The method as claimed in claim 18, wherein the through hole is formed to expose the magnetic tunnel junction pattern and at least a portion of the capping layer covering a side surface of the top electrode.

20. The method as claimed in claim 14, further comprising forming an interconnection structure to fill the through hole, after the performing of the thermal treatment process.

* * * * *